(12) United States Patent
Muray et al.

(10) Patent No.: US 6,195,214 B1
(45) Date of Patent: Feb. 27, 2001

(54) MICROCOLUMN ASSEMBLY USING LASER SPOT WELDING

(75) Inventors: Lawrence Peter Muray, Moraga; Kim Y. Lee, Fremont; Stephen A. Rishton, Hayward, all of CA (US); Ho-Seob Kim, Inchon (KR); Tai-Hon Philip Chang, Foster City, CA (US)

(73) Assignee: Etec Systems, Inc., Hayward, CA (US)

( * ) Notice: Subject to any disclaimer, the term of this patent is extended or adjusted under 35 U.S.C. 154(b) by 0 days.

(21) Appl. No.: 09/364,822

(22) Filed: Jul. 30, 1999

(51) Int. Cl.$^7$ ............................. G02B 7/02; G01N 23/00; G21K 7/00
(52) U.S. Cl. ............................. 359/819; 250/310
(58) Field of Search .................... 359/819, 811; 205/769; 250/310, 396 R

(56) References Cited

U.S. PATENT DOCUMENTS

| | | | |
|---|---|---|---|
| 4,822,167 | * 4/1989 | Lobazov et al. | 356/317 |
| 5,122,663 | 6/1992 | Chang et al. | 250/310 |
| 5,155,412 | 10/1992 | Chang et al. | 315/14 |
| 5,789,748 | * 8/1998 | Liu et al. | 250/310 |
| 6,077,417 | * 6/2000 | Lee et al. | 205/769 |

OTHER PUBLICATIONS

Chang, T.H.P. et al, "Electron beam microcolumn technology and applications" Proceedings Reprint, reprinted from Electron–Beam Sources and Charged–Particle Optics by the *Society of Photo–Optical Instrumentation Engineers*, vol. 2522, pp. 4–12 (1995).

Chang, T.H.P. et al., "Electron–beam microcolumns for lithography and related applications" *J. Vac. Sci. Technol.* B. 14(6) pp. 3774–3781 (1996).

Chang, T.H.P. et al., "Electron beam technology — SEM to microcolumn" *Microelectronic Engineering 32* pp. 113–130 (1996).

Kim, H.S. et al., "Miniature Schottky electron source" *J. Vac. Sci. Technology* B 13(6), pp. 2468–2472 (1995).

Kratschmer, E. et al., "Experimental evaluation of a 20×20 mm footprint microcolumn" *J. Vac. Sci. Technology* B 14(6), pp. 3792–3796 (1996).

Lee, K. Y. et al., "High aspect ratio aligned multilayer microstructure fabrication" *J. Vac. Sci. Technology* B 12(6), pp. 3425–3430 (1994).

Thomson, M.G.R. and Chang, T.H.P., "Lens and deflector design for microcolumns" *J. Vac. Sci. Technology* B 13(6), pp. 2445–2449 (1995).

\* cited by examiner

*Primary Examiner*—Ricky Mack
(74) *Attorney, Agent, or Firm*—Skjerven Morrill MacPhearson; Greg Leitich

(57) ABSTRACT

A method for forming microcolumns in which laser spot welding bonds the multiple layers of an electron beam microcolumn. A silicon microlens is laser spot welded to a glass insulation layer by focusing a laser through the insulation layer onto the silicon microlens. The glass layer is transparent to the laser, allowing all of the energy to be absorbed by the silicon. This causes the silicon to heat, which, in turn, heats the adjacent surface of the glass insulation layer creating a micro-weld between the silicon and glass. The insulation layer includes a portion which protrudes beyond the edge of the first microlens so that when a second microlens is attached to the opposite side of the insulation layer, the second microlens can be laser spot welded to the protruding portion of the insulation layer by focusing a laser through the protruding portion of the insulation layer to heat the second microlens.

24 Claims, 8 Drawing Sheets

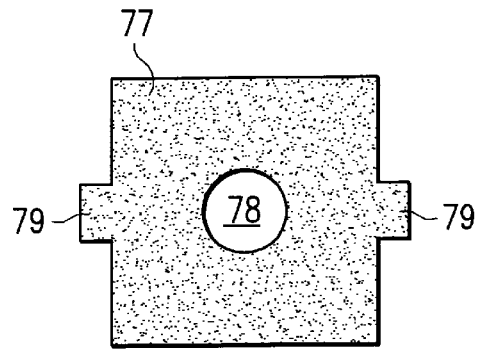
FIG. 4(a)(1)
FIG. 4(a)(2)
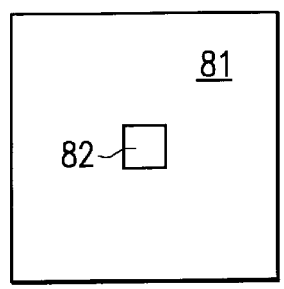
FIG. 4(b)(1)
FIG. 4(b)(2)
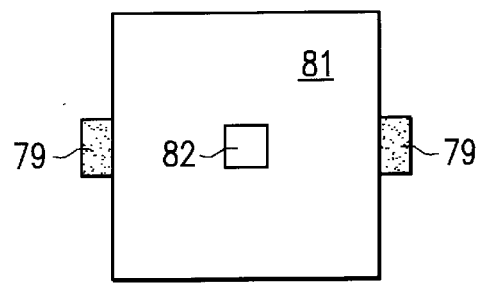
FIG. 4(c)(1)
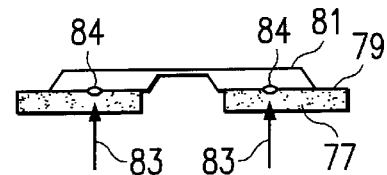
FIG. 4(c)(2)
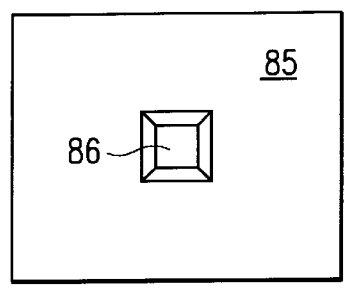
FIG. 4(d)(1)
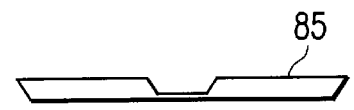
FIG. 4(d)(2)

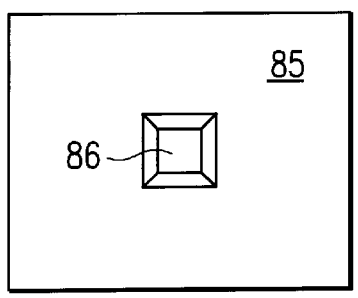
FIG. 4(e)(1)
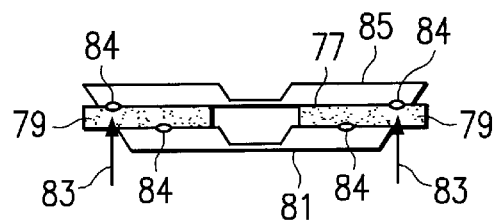
FIG. 4(e)(2)
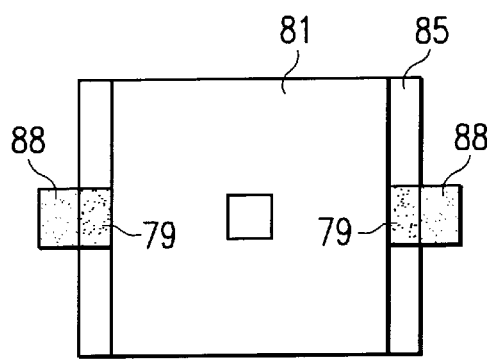
FIG. 4(f)(1)
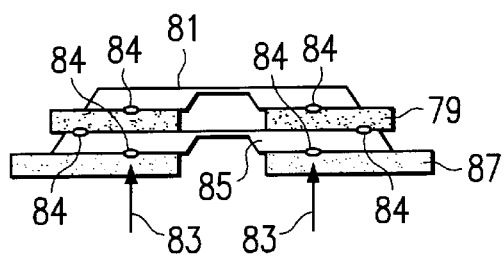
FIG. 4(f)(2)
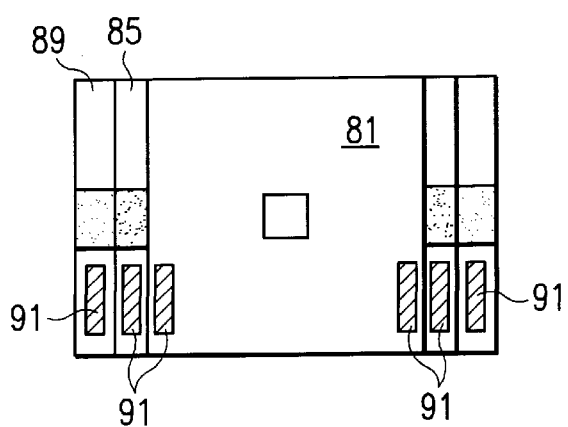
FIG. 4(g)(1)
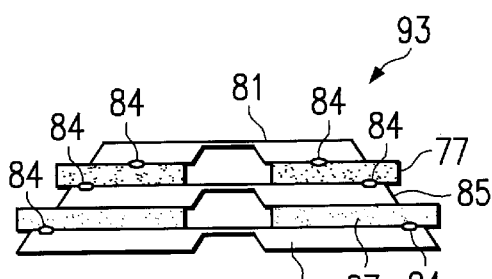
FIG. 4(g)(2)

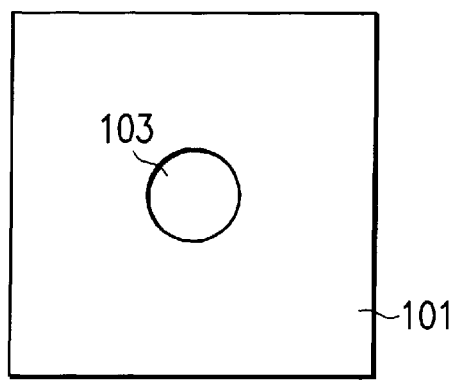
FIG. 5(a)(2)
FIG. 5(a)(1)
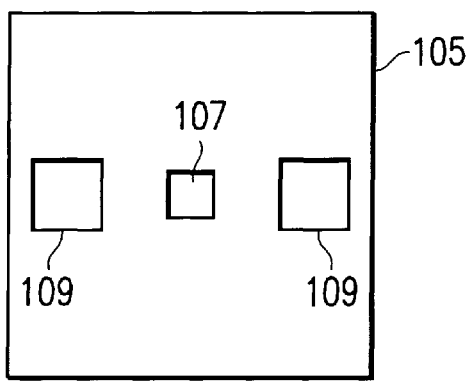
FIG. 5(b)(2)
FIG. 5(b)(1)
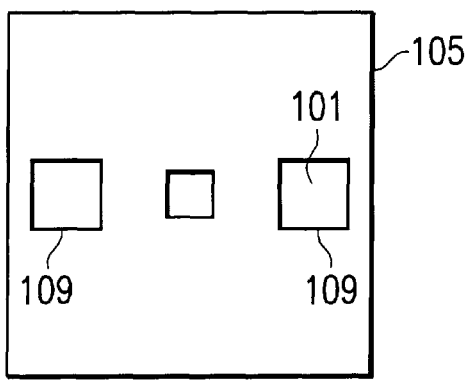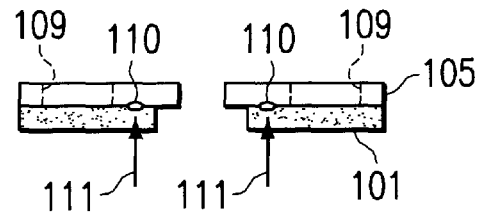
FIG. 5(c)(2)
FIG. 5(c)(1)

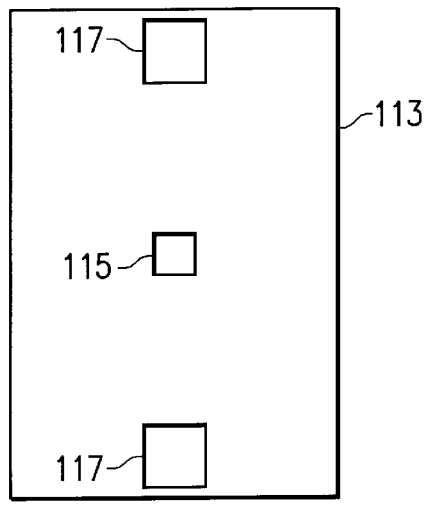
FIG. 5(d)(1)
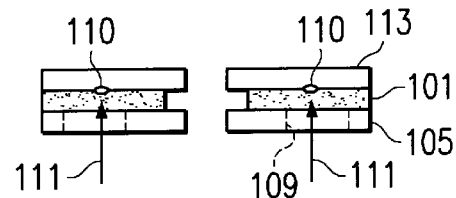
FIG. 5(d)(2)
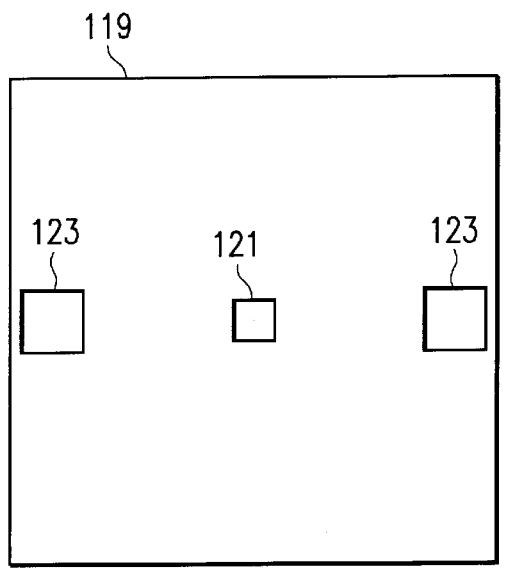
FIG. 5(e)(1)
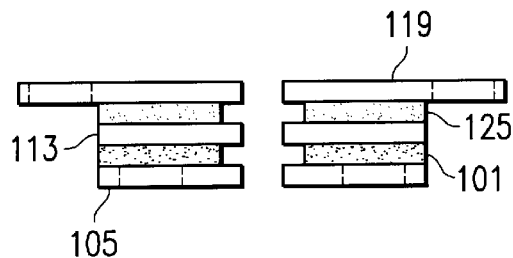
FIG. 5(e)(2)

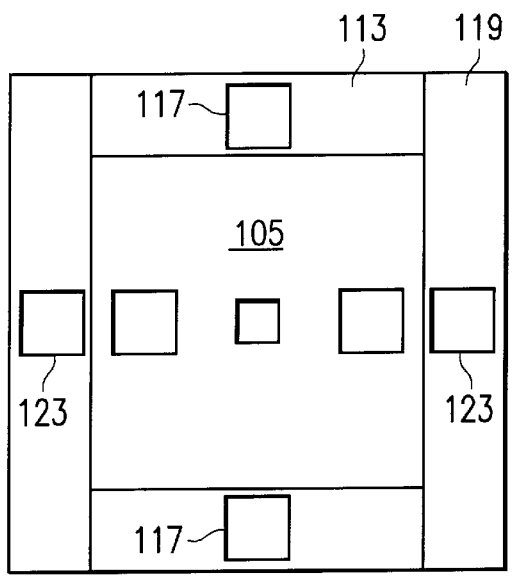
FIG. 5(f)(1)
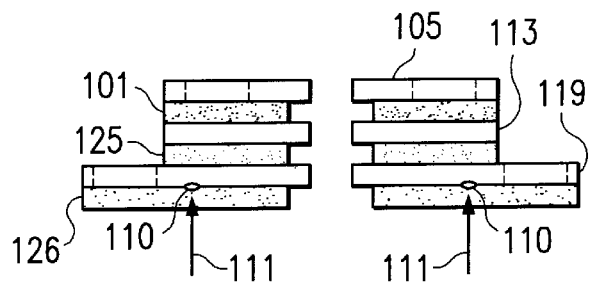
FIG. 5(f)(2)
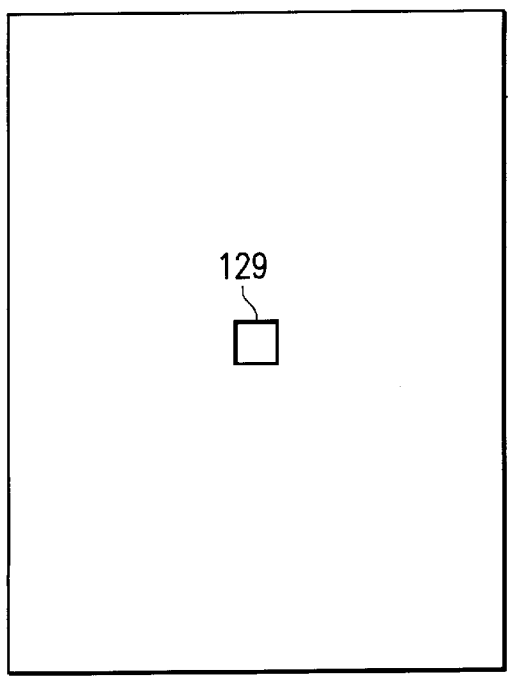
FIG. 5(g)(1)
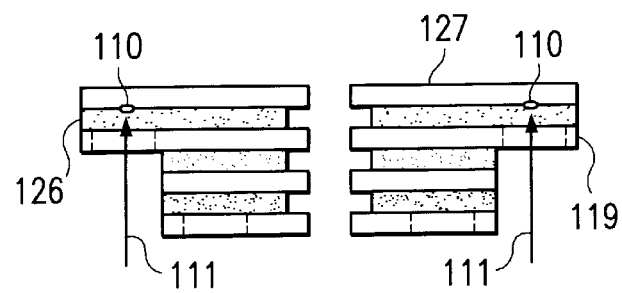
FIG. 5(g)(2)

MICROCOLUMN ASSEMBLY USING LASER SPOT WELDING

FIELD OF THE INVENTION

This invention relates to electron beam microcolumns, and in particular to a microcolumn assembly technique.

BACKGROUND OF THE INVENTION

Electron beam microcolumns based on microfabricated electron optical components and field emission sources operating under the scanning tunneling microscope (STM) aided alignment principle were first introduced in the late 1980s. Electron beam microcolumns are used to form a finely focused electron beam. See Chang, T. et al., "Electron-Beam Microcolumns for Lithography and Related Applications" *J. Vac. Sci. Technology*, B 14(6), pp. 3774–3781, November/December 1996, and Lee, K. et al, "High Aspect Ratio Aligned Multilayer Microstructure Fabrication" *J. Vac. Sci. Technology*, B 12(6), pp. 3425–3430, November/December 1994, incorporated by reference herein. These columns offer the advantages of extremely high resolution with improved beam current, small physical size, and low cost, and can be used in a wide variety of applications, such as electron beam lithography.

Microcolumns are high-aspect-ratio micromechanical structures comprised of microlenses and deflectors. The microlenses are multilayers of silicon chips (with membrane windows for the lens electrodes) or silicon membranes spaced apart by thick, 100–500 $\mu$m, insulating layers. The lenses have bore diameters that vary from a few to several hundred micrometers. For optimum performance, the roundness and edge acuity of the bores are required to be in the nanometer regime and alignment accuracy between components on the order of less than 1 $\mu$m.

Electrodes of the microlenses can be made from 1 to 2.5 $\mu$m thick silicon membranes by electron-beam lithography and reactive-ion etching (RIE). The starting material is a 4 inch diameter and 500-$\mu$m-thick double-sided polished wafer containing arrays of 7 mm×7 mm chips. At the center of each chip is a 1 mm×1 mm membrane formed by wet isotropic etching using in preferred form either a highly boron doped or a reverse-biased p/n junction etch stop.

Assembly of the lenses and the column typically involves stacking together silicon components and Pyrex spacers and using anodic bonding.

FIG. 1 shows a cross-sectional view of a 1 kV microcolumn based on the well-known STM aligned field emission (SAFE) concept, showing source section 1 and Einzel lens section 3. Scanning tunneling microscope (STM) scanner 5 emits an electron beam 6 in the direction of sample plane 25. The beam 6 first passes through the source 1, composed of silicon microlenses, 5 $\mu$m diameter extractor 7, 100 $\mu$m diameter anode 11, and 2.5 $\mu$m diameter limiting aperture 13. The three microlenses are separated by two insulating spacers 9. The insulating spacers 9 are preferably formed of Pyrex, but could be made of any other suitable insulator, such as SD-2 glass made by Hoya. The source 1 is mounted on aluminum mounting base 15, which contains an octupole scanner/stigmator 17. The electron beam 6 then passes through the Einzel lens 3, which is composed of two 100–200 $\mu$m diameter silicon microlenses 19 and 23 with a 1–1.5 $\mu$m thick free-standing silicon membrane 21 disposed therebetween. Each silicon layer is again separated by insulating spacers 9. The electron beam 6 then passes on to sample plane 25 and channeltron detector 27.

The source 1 and Einzel lens 3 are shown expanded and in greater detail in FIGS. 2(*a*)–(*b*) with similar reference numbers identifying the same structures.

The conventional approach to bonding the insulating and microlens layers of the microcolumn involves the use of anodic bonding. Anodic bonding is an electrochemical process for heat sealing of glass to metal and semiconductors, as shown in FIGS. 3(*a*) and (*b*). At elevated temperatures (300–600° C.), $Na_2O$ in the Pyrex or other glass dissociates to form sodium and oxygen ions. By applying a potential with voltage source 52 between a first silicon layer 53 and a glass insulation layer 55, sodium ions in the glass migrate from the interface in a direction indicated by arrow 63, while uncompensated oxygen anions 61 move toward the induced positive charge 59 of the silicon anode to form chemical bonds.

This process, previously used for single sided bonding only, has been extended to multilayer bonding. After the first silicon-to-glass bond, another silicon chip or membrane can be bonded to the free surface of the glass by reversing the applied potential, as shown in FIG. 3(*b*). In this case, second silicon layer 57 is placed atop glass insulation layer 55 and an opposite potential is applied by voltage source 52. Here, the induced positive charge 59 causes the sodium ions to migrate downward in the direction of arrow 63, causing the oxygen anions 61 to form chemical bonds with the second silicon layer 57. To achieve satisfactory multilayer bonding, special attention has to be given to the control of temperature, the applied voltage, the bonding time, and, in particular, the surface condition of the layers.

One disadvantage of the anodic bonding process is that it must be conducted at elevated temperatures, which typically requires several hours of heat-up (to approximately 400° C.) and cool-down time, as well as a physical connection of a high voltage probe, during which time drift, bond-induced shift, and expansion can cause the alignment to degrade. This process must then be repeated for each additional layer.

Accordingly, it is clear that there is a need for a method of forming microcolumn structures that avoids the burden of anodically bonding each layer of glass to silicon.

SUMMARY

In accordance with the present invention, a method for forming microcolumns is provided in which laser spot welding is utilized to bond the multiple layers of an electron beam microcolumn.

In one embodiment, a first microlens is welded to a glass insulation layer by focusing a laser through the insulation layer onto the silicon microlens. The glass is transparent to the laser, allowing all of the energy to be absorbed by the silicon. This causes the silicon to heat, which, in turn, heats the adjacent surface of the glass insulation layer creating a micro-weld between the silicon and glass.

The insulation layer includes a portion which protrudes beyond the edge of the first microlens so that when a second microlens is attached to the opposite side of the insulation layer, the second microlens can be laser spot welded to the portion of the insulation layer which protrudes beyond the edge of the first microlens.

In a second embodiment, in place of the protruding portion of the insulation layer, the first microlens includes a window so that a laser may be shone through the window and through the insulation layer to irradiate the second microlens disposed opposite the first microlens.

In another embodiment, the present method is used for batch fabrication of microcolumns. Using the second embodiment of this invention, wafer-scale microlens and insulative layers are bonded together.

BRIEF DESCRIPTION OF THE DRAWINGS

FIGS. 4(a)–4(g) illustrate the process for assembling a 3-element microcolumn according to the present invention.

FIGS. 5(a)–5(g) illustrate the process for assembling a 3-element microcolumn according to a second embodiment of the present invention.

DETAILED DESCRIPTION

Figure 1:
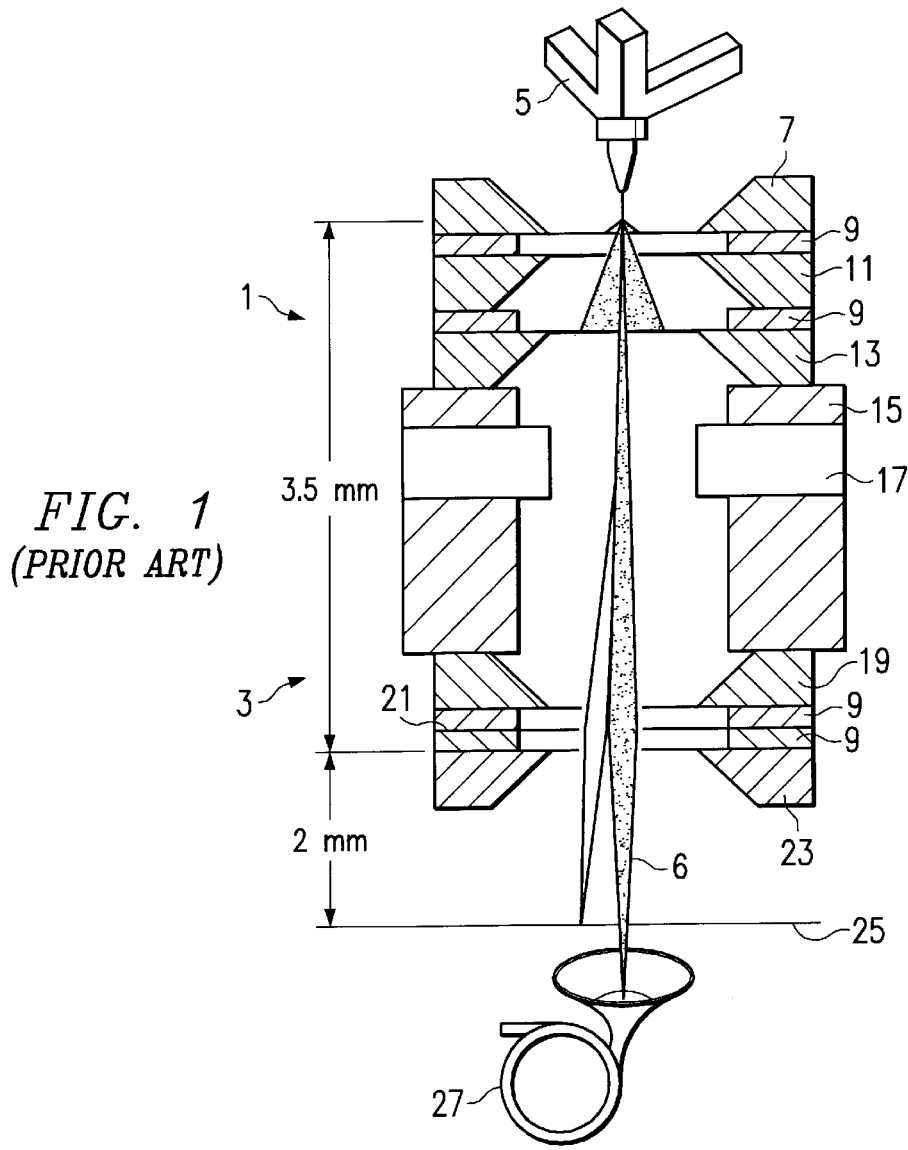
FIG. 1 illustrates a cross-sectional view of a microcolumn.

FIGS. 4(a) to 4(g) show the assembly process for manufacturing a microcolumn according to the present invention. FIG. 4(a) shows a first insulation layer 77 with an aperture 78 and two extensions, or "ears" 79, laterally protruding from opposite edges of first insulation layer 77. First insulation layer 77 is, e.g., a glass such as Pyrex. A plan view and a side view of first insulation layer 77 are shown.

FIG. 4(b) shows a first microlens 81 with a central membrane 82. The membrane 82 is a thin (1–2.5 μm) membrane defining a small aperture. In one embodiment, first microlens 81 is made of silicon and has a plan size of approximately 6 mm×6 mm. FIG. 4(c) shows how first insulation layer 77 and first microlens 81 are positioned so aperture 78 and membrane 82 are aligned. Because the microlens apertures of microcolumns can be on the order of 2 μm or smaller, it is imperative that the multiple layers of the microcolumns be precisely aligned.

When the layers are properly aligned, as shown in FIG. 4(c), a Nd-YAG laser is aimed through first insulation layer 77 in the direction of arrows 83 and is focused to a spot approximately 100 μm in diameter on the bottom surface of first microlens 81. An exemplary laser is available from Alpha Laser GmbH, and is a pulsed Nd-YAG, type ALF35 laser, with a wavelength of 1064 nm.

The radiation from the laser passes through the insulation layer 77 and is absorbed in the first microlens 81. The first insulation layer 77 is substantially transparent to the laser so that all energy is absorbed only by the first microlens 81.

The energy absorbed by the silicon causes the bottom surface of first microlens 81 to heat to a temperature of approximately 1000° C., at which point the silicon begins to melt and recrystallize. The heating of the first microlens 81 causes a heating of the adjacent portion of first insulation layer 77. At approximately 400–500° C., the glass first insulation layer 77 begins to flow. At this point, a microweld of approximately 100 μm in diameter begins to form between the two layers at the location of laser spot weld, or micro-weld, 84. Note that the laser beam itself does not directly cause the heating of the glass in the first insulation layer 77. Instead, the laser beam shines through the glass in the direction of arrows 83 to heat the silicon of the first microlens 81, which subsequently heats the insulation layer 77.

As can be seen in FIG. 4(c), when the similarly-sized first insulation layer 77 and the first microlens 81 are stacked atop each other, the ears 79 of first insulation layer 77 protrude beyond the edge of first microlens 81. The ears 79 may be of any shape or placement provided they extend beyond the edges of the microlenses 81. This is useful in order for subsequent welds to be carried out, as will be seen later.

FIG. 4(d) shows second microlens 85 with a membrane 86, also made of silicon, to be added to the microcolumn. FIG. 4(e) shows the alignment of second microlens 85 with the first microlens 81 and first insulation layer 77. In this figure, the welded layers from FIG. 4(c) are inverted to orient the first insulation layer 77 such that it is located between first microlens 81 and second microlens 85.

In one form, second microlens 85 has a surface area which measures approximately 8 mm×6 mm. Notably, the ears 79 protrude beyond the edge of first microlens 81, but are covered, at least in part, by second microlens 85. This way, when the laser beam is shined upwards in the direction of arrows 83, there is a portion of first insulation layer 77 which is not covered by first microlens 81 so that the laser beam may pass through to irradiate the surface of second microlens 85. If the first insulation layer 77 were entirely covered by first microlens 81, the energy from the laser would be absorbed by first microlens 81 and no weld could be formed between the second microlens 85 and the first insulation layer 77. In the same way in which first microlens 81 and first insulation layer 77 were laser spot welded, as described above, a microweld 84 is formed by the laser beam between the second microlens 85 and the ear 79 of first insulation layer 77.

FIG. 4(f) shows the microcolumn 93 with a second insulation layer 87 attached. Second insulation layer 87 is welded to second microlens 85 using the same process as described with respect to FIG. 4(c), i.e., the laser is shined in the direction of arrows 83 to form micro-welds 84. As can be seen, the second insulation layer 87 includes ears 88 which protrude beyond the edge of second microlens 85 and are used in the next step to form laser spot welds with third microlens 89, which may, in this embodiment, have a 10 mm×6 mm surface area.

Finally, in FIG. 4(g), third microlens 89 is welded to third insulation layer 87 using micro-welds 84 in the same way in which second microlens 85 is welded to first insulation layer 77, as shown in FIG. 4(e).

In the embodiment shown, the ears 79 and 88 are rectangular tabs which extend beyond opposite edges of the microlenses 81 and 85. This allows for optimal miniaturization, stability, and strength, while leaving portions of the microlenses 85 and 89 uncovered to allow for electrical contacts to be formed at contact points 91, shown in FIG. 4(g). It is not required that multiple tabs be used, nor that they take this particular shape or arrangement.

One advantage of laser spot welding according to the present invention is that the entire microcolumn can be assembled at room temperature, thus decreasing costs and increasing accuracy. This process also allows any number of layers to be assembled, irrespective of total thickness. This enables a complete column to be assembled using one technique. The laser spot welding technique also allows a wide variety of dielectrics to be used as insulation layers in the microcolumn. The low-temperature process according to the present invention allows the use of a broader range of dielectrics with coefficients of thermal expansion that need not closely approximate that of silicon. Also, no physical connection to the individual elements is required to form the bond, eliminating another possible source for misalignment.

If additional structural strength is required, the microcolumn may be anodically bonded after the laser spot welds are formed. While this diminishes the speed advantage of the laser welds, it still allows the elements to be precisely aligned using the laser welds as a temporary tacking process prior to the anodic bonding. The anodic bonding can take place after each layer is tacked, or it can be done after the entire column is formed using laser bonds.

FIGS. 5(a)–5(g) show a second embodiment of this invention. FIG. 5(a) shows a first insulation layer 101 with an aperture 103. First insulation layer 101 is substantially the same as first insulation layer 77 in FIG. 4(a), except it does not include ears 79. FIG. 5(b) shows first microlens 105 with membrane 107 and two "windows" 109. FIG. 5(c) shows the welding of the first insulation layer 101 and the first microlens 105. A laser is shined through first insulation layer 101, as described above with respect to FIG. 4(c), and is used to heat first microlens 105, causing micro-welds 110. Because there are no elements blocking first insulation layer 101, the micro-welds 110 can be formed at any point on the bottom surface of first microlens 105.

In FIG. 5(d), the structure from FIG. 5(c) is inverted, and second microlens 113 is placed atop first insulation layer 101. A laser beam is shined in the direction of arrows 111 through windows 109 and first insulation layer 101, and is focused on the bottom surface of second microlens 113 to form micro-welds 110. The windows 109 can be of any size or shape, but in one form measure 100 $\mu$m×100 $\mu$m, the size of the focal spot of the laser beam. It is only necessary that the windows 109 be large enough to allow the laser beam to pass through first microlens 105 unobstructed.

FIG. 5(e) shows third microlens 119 with membrane 121 and windows 123. Note that windows 109, 117, and 123 have been provided in pairs on alternating sides. The windows may be formed in any location provided the laser beam can pass unobstructed through the window and insulation layer to the next microlens layer to be welded. Therefore, the window must be formed in a portion of each successive microlens layer which overhangs, or extends beyond the edges of, the previously welded microlens layer. By providing the windows along alternating edges, the microlenses 105, 113, 119, and 127 can increase in size in a symmetrical fashion.

Third microlens 119 is laser spot welded to second insulation layer 125, which was welded to second microlens 113 in a step not shown in the figures. A laser beam is focused through windows 117 and second insulation layer 125 to form a micro-weld between third microlens 119 and second insulation layer 125. Note that because of the location of windows 117 on second microlens 113, the windows 117 cannot be seen in the side view shown in FIG. 5(e).

In FIG. 5(f), the structure from FIG. 5(e) is inverted and a third insulation layer 126 is welded to third microlens 119. This is accomplished by focusing a laser beam in the direction of arrows 111 to heat third microlens 119, creating micro-welds 110.

The structure is again inverted and fourth microlens 127 is positioned at the top of the microcolumn, precisely aligning the apertures in membranes 129, 121, 115, and 107, as shown in FIG. 5(g). A laser beam is focused through windows 123 of third microlens 119 and third insulation layer 126 to form a micro-weld 110 between fourth microlens 127 and third insulation layer 126. From the side view, it can be seen that a portion of third microlens 119 extends beyond the edges of first and second microlenses 105 and 113, and that this portion contains the windows 123.

The use of windows according to the second embodiment of the present invention can also be applied to a batch fabrication process of forming microcolumns. Thus, a large number of microlenses may be easily welded together to simultaneously form a plurality of microcolumns of any size, using standard semiconductor wafer processing techniques. A wafer formed according to this embodiment is shown, in part, in FIG. 6.

Figure 6:
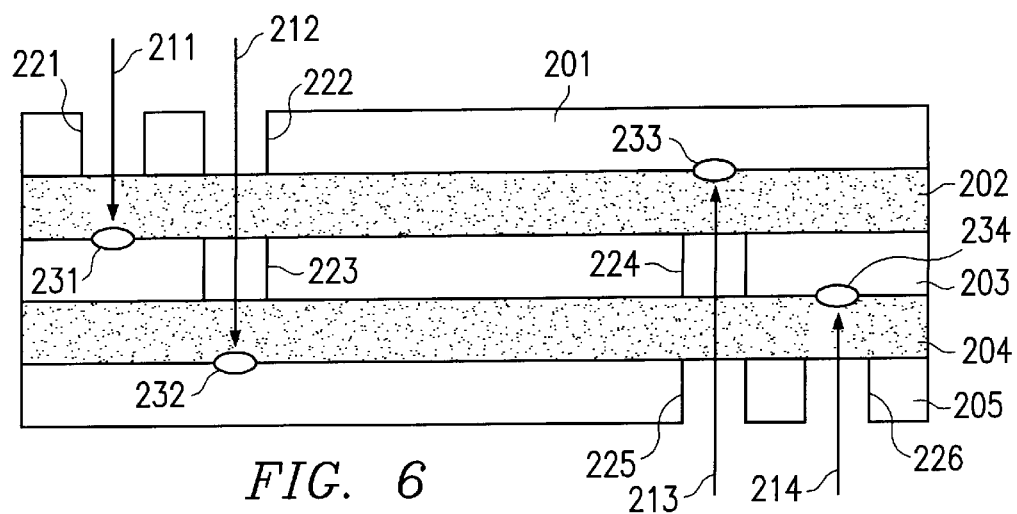
FIG. 6 illustrates the assembly of a microcolumn according to a third embodiment of the present invention.
Figure 2A:
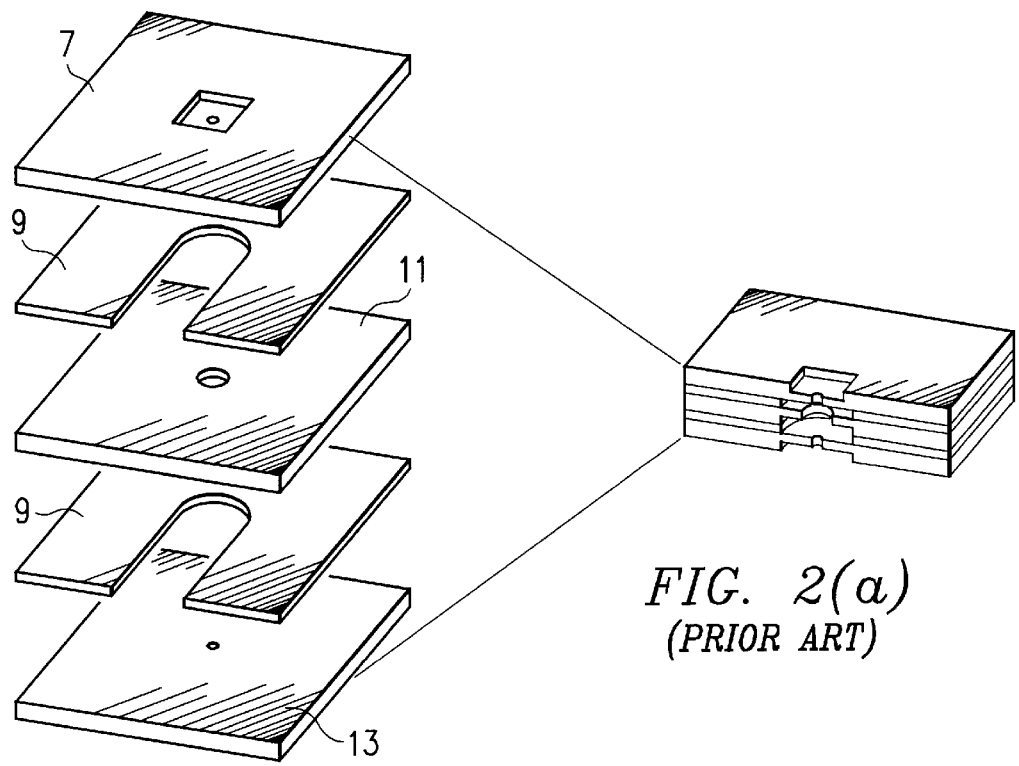
FIGS. 2(a) and 2(b) illustrate an expanded, three-dimensional view of the source and Einzel lens sections.
Figure 2B:
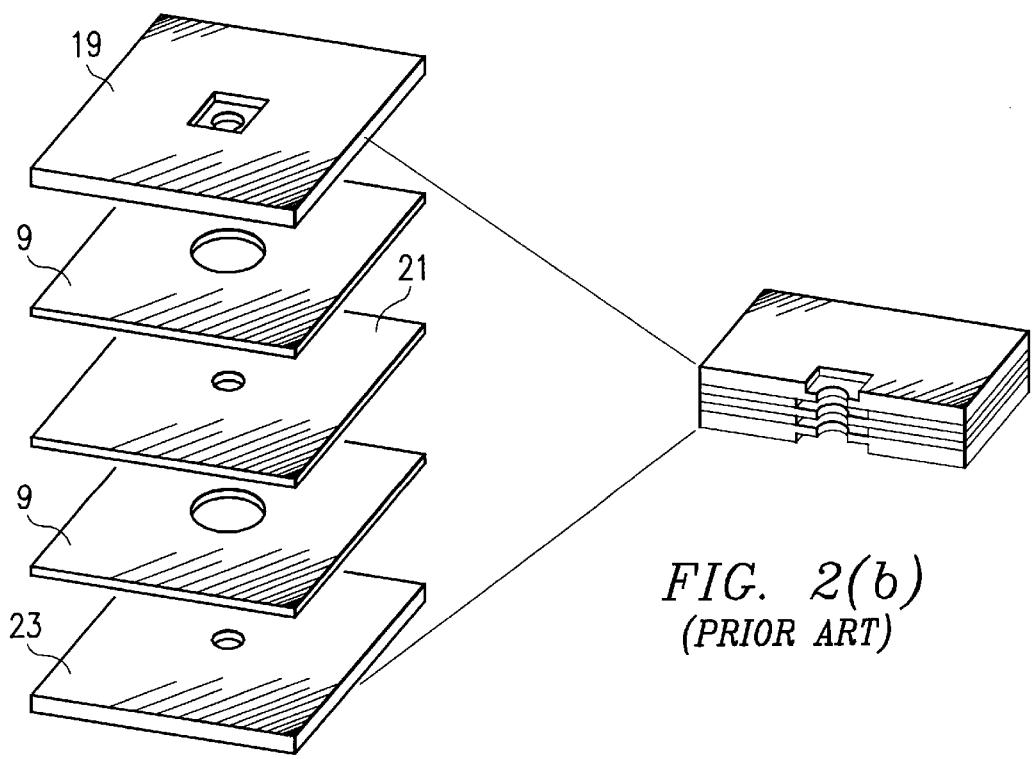
Figure 3A:
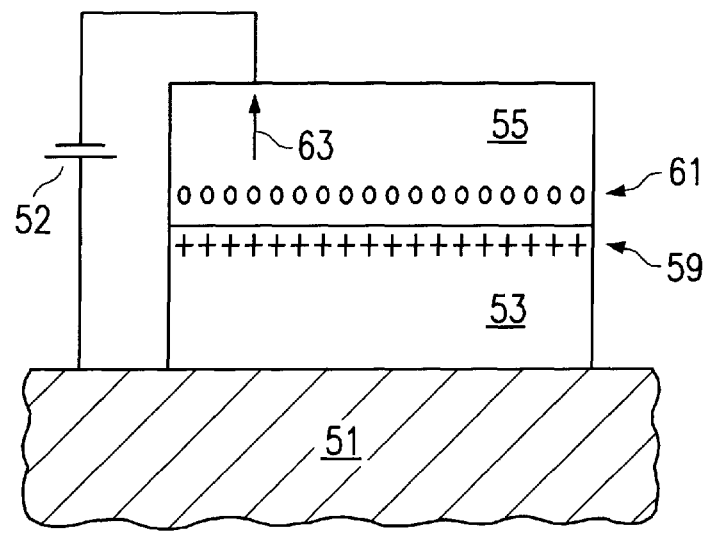
FIGS. 3(a) and 3(b) illustrate the anodic bonding process.
Figure 3B:
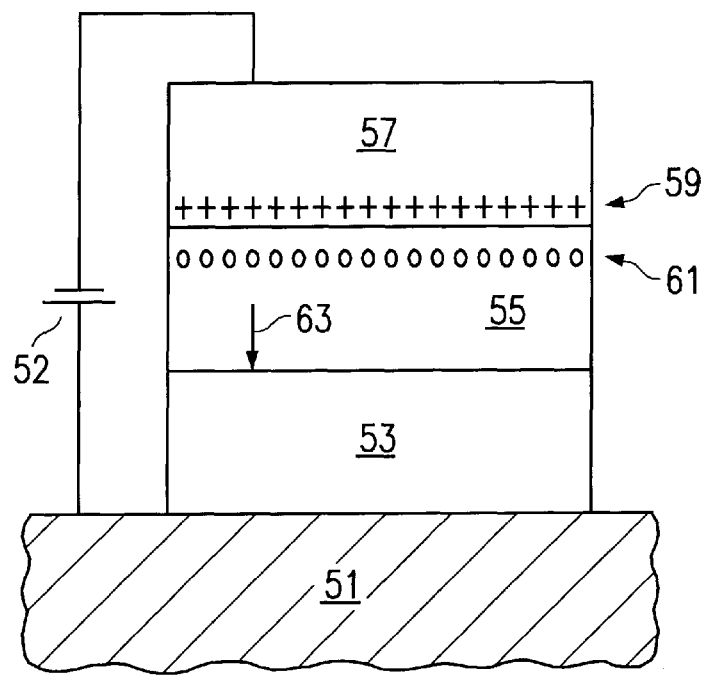

FIG. 6 shows three microlenses 201, 203, 205, bonded together with insulation layers 202 and 204 interposed between the microlenses 201, 203, 205. First microlens 201 is etched to form windows 221, 222. These windows 221, 222 enable a laser to be focused on underlying layers for welding. Here, a laser is focused in the direction of arrow 211 to form microweld 231 between first insulation layer 202 and second microlens 203. Second microlens 203 is etched to include windows 223, 224. Window 222 in first microlens 201 is aligned with window 223 in second microlens 203 such that a laser can be shined in the direction of arrow 212 through window 222, first insulation layer 202, and window 223 to form microweld 232 between second insulation layer 204 and third microlens 205.

Windows 224, 225, 226 in microlenses 203, 205 are used in a similar fashion. A laser is shined in the direction of arrows 213 and 214 to form microwelds 233 and 234, thus bonding first microlens 201 to first insulation layer 202 and second microlens 203 to second insulation layer 204.

It will be understood that FIG. 6 only illustrates a portion of the wafer according to the batch fabrication process of the present invention. The process described with respect to FIG. 6 is repeated across the surface of the entire wafer for each individual microcolumn. After the layers are bonded together, the wafer can then be diced into the individual microcolumns.

Although the invention has been described with reference to particular embodiments, the description is only an example of the invention's application and should not be taken as a limitation. Various other adaptations and combinations of features of the embodiments disclosed are within the scope of the invention as defined by the following claims.

We claim:

1. A method for forming a microcolumn assembly, comprising:

providing an insulation layer having a top surface and an opposing bottom surface;

positioning a first microlens adjacent the bottom surface of the insulation layer;

directing a laser beam through the insulation layer to irradiate a portion of a surface of the first microlens adjacent the bottom surface of the insulation layer, thereby to weld the first microlens to the insulation layer;

positioning a second microlens adjacent the top surface of the insulation layer; and directing a laser beam through the insulation layer to irradiate a portion of a surface of the second microlens adjacent the top surface of the insulation layer, thereby to weld the second microlens to the insulation layer.

2. The method of claim 1, wherein said insulation layer is comprised of glass.

3. The method of claim 1, wherein said first and second microlenses are comprised of silicon.

4. The method of claim 1, wherein the first directing comprises heating said portion of the surface of the first microlens with said laser beam to a temperature of at least approximately 1000° C., said heated portion of the first microlens thereby causing an adjacent portion of the insulation layer to be heated, thereby resulting in a micro-weld between the first microlens and the insulation layer.

5. The method of claim 1, wherein the second directing comprises heating said portion of the surface of the second microlens with said laser beam to a temperature of at least approximately 1000° C., said heated portion of the second microlens thereby causing an adjacent portion of the insulation layer to be heated, thereby resulting in a micro-weld between the second microlens and the insulation layer.

6. The method of claim 1, further comprising anodically bonding the first and second microlenses to the insulation layer.

7. The method of claim 1, wherein:
said providing comprises providing an insulation layer including a laterally protruding portion;
said first positioning comprises positioning the first microlens such that the laterally protruding portion of said insulation layer extends beyond an edge of the first microlens;
said second positioning comprises positioning the second microlens such that the second microlens overlies said laterally protruding portion of the insulation layer; and
said second directing comprises directing the laser beam through said laterally protruding portion of the insulation layer to irradiate the portion of the surface of the second microlens adjacent the top surface of the insulation layer.

8. The method of claim 7, wherein said laterally protruding portion of said insulation layer comprises two extensions, each extension being located along opposite edges of said insulation layer.

9. The method of claim 7, wherein said laterally protruding portion has a surface area of at least approximately 300 $\mu$m×300 $\mu$m.

10. The method of claim 1, wherein:
said first positioning comprises positioning a first microlens having at least one window defined therein; and
said second directing comprises directing the laser beam through said at least one window and said insulation layer to irradiate the portion of the surface of the second microlens.

11. The method of claim 10, wherein said at least one window measures at least approximately 100 $\mu$m×100 $\mu$m.

12. The method of claim 10, wherein said first microlens defines two windows.

13. The method of claim 10, wherein said first positioning further comprises positioning a first semiconductor layer adjacent the bottom surface of the insulation layer, said first semiconductor layer having a top surface and including a plurality of microlenses, and further comprising:
forming at least one window in each of said plurality of microlenses.

14. The method of claim 13, wherein said forming comprises forming two windows in each of said microlenses.

15. A microcolumn, comprising:
an insulation layer having a top surface and an opposing bottom surface;
a first microlens spot welded to the bottom surface of said insulation layer; and
a second microlens spot welded to the top surface of said insulation layer.

16. The microcolumn of claim 15, wherein said insulation layer is comprised of glass.

17. The microcolumn of claim 15, wherein said first and second microlenses are comprised of silicon.

18. The microcolumn of claim 15, wherein at least one of said first and second microlenses is additionally bonded to said insulation layer.

19. The microcolumn of claim 15, wherein:
said insulation layer has a laterally protruding portion which extends beyond an edge of the first microlens; and
said second microlens overlies said laterally protruding portion of the insulation layer and is spot welded to said laterally protruding portion.

20. The microcolumn of claim 19, wherein said laterally protruding portion of said insulation layer comprises two extensions, each extension being located along opposite edges of said insulation layer.

21. The microcolumn of claim 19, wherein said laterally protruding portion has a surface area of at least approximately 300 $\mu$m×300 $\mu$m.

22. A microcolumn of claim 15, wherein:
said first microlens includes at least one window; and
said second microlens is spot welded to the top surface of the insulation layer at a location exposed by said at least one window.

23. The microcolumn of claim 22, wherein said at least one window measures at least approximately 100 $\mu$m×100 $\mu$m.

24. The microcolumn of claim 22, wherein said at least one window comprises two windows.

* * * * *